US009576992B2

(12) United States Patent
Jeon et al.

(10) Patent No.: US 9,576,992 B2
(45) Date of Patent: Feb. 21, 2017

(54) LIGHT-SENSING APPARATUSES, METHODS OF DRIVING THE LIGHT-SENSING APPARATUSES, AND OPTICAL TOUCH SCREEN APPARATUSES INCLUDING THE LIGHT-SENSING APPARATUSES

(75) Inventors: Sang-hun Jeon, Seoul (KR); I-hun Song, Gyeonggi-do (KR); Seung-eon Ahn, Gyeonggi-do (KR); Chang-jung Kim, Gyeonggi-do (KR); Young Kim, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 723 days.

(21) Appl. No.: 13/435,666

(22) Filed: Mar. 30, 2012

(65) Prior Publication Data
US 2012/0327032 A1 Dec. 27, 2012

(30) Foreign Application Priority Data
Jun. 22, 2011 (KR) .................. 10-2011-0060797

(51) Int. Cl.
*H01L 27/00* (2006.01)
*H01L 27/146* (2006.01)
*G06F 3/042* (2006.01)

(52) U.S. Cl.
CPC ......... *H01L 27/14609* (2013.01); *G06F 3/042* (2013.01); *G06F 2203/04103* (2013.01)

(58) Field of Classification Search
CPC .............................. H01L 27/1446; H01L 27/00
See application file for complete search history.

(56) References Cited

U.S. PATENT DOCUMENTS

| 4,582,395 | A | * | 4/1986 | Morozumi | ....................... 349/43 |
| 2001/0030324 | A1 | * | 10/2001 | Morikawa | ......... H01L 27/14609 |
| | | | | | 257/59 |
| 2007/0045552 | A1 | * | 3/2007 | Masazumi | .............. G01T 1/244 |
| | | | | | 250/370.09 |
| 2009/0315590 | A1 | * | 12/2009 | Yin et al. | ....................... 326/119 |
| 2011/0063243 | A1 | * | 3/2011 | Kim et al. | ..................... 345/174 |
| 2012/0267513 | A1 | | 10/2012 | Jeon et al. | |

FOREIGN PATENT DOCUMENTS

| KR | 20110111110 A | 10/2011 |
| KR | 20110124585 A | 11/2011 |
| KR | 20120037683 A | 4/2012 |
| KR | 2012-0120707 A | 11/2012 |

* cited by examiner

*Primary Examiner* — Mohammad Choudhry
(74) *Attorney, Agent, or Firm* — Harness, Dickey & Pierce, P.L.C.

(57) ABSTRACT

Light-sensing apparatuses may include a light sensor transistor and a switching transistor in a light-sensing pixel, the transistors being oxide semiconductor transistors. In the light-sensing apparatus, the light sensor transistor and the switching transistor in the light-sensing pixel may be adjacently formed on one substrate, the switching transistor including a channel material that is relatively less light-sensitive than the light sensor transistor and is stable, and the light sensor transistor includes a channel material that is relatively light-sensitive. The light sensor transistor may include a transparent upper electrode on a surface of a channel, and a negative voltage may be applied to the transparent upper electrode, whereby a threshold voltage shift in a negative voltage direction may be prevented or reduced.

22 Claims, 7 Drawing Sheets

LIGHT-SENSING APPARATUSES, METHODS OF DRIVING THE LIGHT-SENSING APPARATUSES, AND OPTICAL TOUCH SCREEN APPARATUSES INCLUDING THE LIGHT-SENSING APPARATUSES

CROSS-REFERENCE TO RELATED APPLICATION

This application claims the benefit of Korean Patent Application No. 10-2011-0060797, filed on Jun. 22, 2011, in the Korean Intellectual Property Office, the disclosure of which is incorporated herein in its entirety by reference.

BACKGROUND

1. Field

Example embodiments relate to light-sensing apparatuses, methods of driving the light-sensing apparatuses, and optical touch screens including the light-sensing apparatus.

2. Description of the Related Art

An oxide semiconductor transistor is a transistor that uses an oxide semiconductor as a material for a channel. For example, an oxide semiconductor transistor may include a substrate, a gate disposed on the substrate, a gate insulating layer disposed on the substrate and the gate so as to cover a surrounding region including the gate, a channel layer formed of the oxide semiconductor and disposed on the gate insulating layer, and a source and a drain that are disposed to cover ends of the channel layer.

The oxide semiconductor transistor may be light-sensitive according to a material of the oxide semiconductor which is used as the channel layer. For example, oxide semiconductor materials which are light-sensitive may include a ZnO-based oxide semiconductor (e.g., ZnO, TaZnO, InZnO(IZO), GaInZnO(GIZO), and the like). In a case where a light sensitive oxide semiconductor material is used as a channel layer, the oxide semiconductor transistor may be used as a light-sensing device due to a characteristic that a threshold voltage and a drain current change according to a wavelength or an amount of an incident light. Due to the aforementioned characteristic, the oxide semiconductor transistor may replace a photodiode having a PN-junction structure which is widely used as a light-sensing device.

In particular, because an oxide semiconductor transistor may generate a larger photocurrent than a photodiode, if an oxide semiconductor transistor is used as the light-sensing device, it is possible to omit a capacitor that is generally used in a light-sensing pixel to accumulate photocurrent generated charges over a period of time. For example, the light-sensing pixel may include an oxide semiconductor transistor for sensing light and a switching transistor for outputting data. Thus, the oxide semiconductor transistor may be used in various apparatuses that sense light, for example, an image-capturing apparatus, an optical touch screen panel, and the like.

However, in an oxide semiconductor transistor that uses an oxide semiconductor as the material for the channel, due to stress caused by light and electricity, a threshold voltage is increasingly shifted in a negative voltage direction over time. In particular, as light-sensitiveness of the material for the channel increases, a threshold voltage shift in the negative voltage direction further increases. When the threshold voltage of the oxide semiconductor transistor is shifted in the negative voltage direction, the oxide semiconductor transistor may not normally perform ON/OFF operations, which may deteriorate an operational reliability of an apparatus that uses the oxide semiconductor transistor.

SUMMARY

Light-sensing apparatuses with improved operational reliability that use oxide semiconductor transistors may be provided. Methods of driving a light-sensing apparatuses that improve operational reliability of the light-sensing apparatuses may be provided. Optical touch screen apparatuses including light-sensing apparatus with improved operational reliability may be provided.

According to at least one example embodiment, a light-sensing apparatus includes a substrate, a light sensor transistor disposed on the substrate and sensing light, a switching transistor disposed on the substrate, the switching transistor outputting data from the light sensor transistor, and an upper electrode that is transparent, disposed on the light sensor transistor, and for applying a negative bias voltage to the light sensor transistor.

The light sensor transistor may include a first gate electrode formed on a portion of the substrate, a gate insulating layer coated on the substrate and the first gate electrode, a first channel layer formed on the gate insulating layer so as to face the first gate electrode, a first source/drain electrode formed at one side of the first channel layer, a second source/drain electrode formed at the other side of the first channel layer, and a passivation layer that is transparent and is formed on the first and second source/drain electrodes and the first channel layer. The upper electrode may be formed on a portion of the passivation layer so as to face the first channel layer.

The first channel layer may include an oxide semiconductor material. The oxide semiconductor material may include a material selected from the group consisting of ZnO, InO, SnO, InZnO, ZnSnO, and InSnO, or may include a mixture of a material selected from the group consisting of ZnO, InO, SnO, InZnO, ZnSnO, and InSnO and at least one selected from the group consisting of Hf, Zr, Ti, Ta, Ga, Nb, V, Al, Ga, and Sn. The first channel layer may include a lower channel layer disposed on the gate insulating layer, and an upper channel layer disposed on the lower channel layer. The lower channel layer may include a material selected from the group consisting of XZnO, XInO, XSnO, XInZnO, XZnSnO, and XInSnO (where X indicates at least one material selected from the group consisting of Hf, Zr, Ti, Ta, Ga, Nb, V, and Al) that are relatively less light-sensitive than the upper channel layer, and the upper channel layer may include a material selected from the group consisting of ZnO, InO, SnO, InZnO, ZnSnO, and InSnO that are relatively light-sensitive.

The switching transistor may include a second gate electrode formed on a portion of the substrate, the gate insulating layer coated on the substrate and the second gate electrode, a second channel layer formed on the gate insulating layer so as to face the second gate electrode, the second source/drain electrode formed at one side of the second channel layer, a third source/drain electrode formed at the other side of the second channel layer, and the passivation layer formed on the second and third source/drain electrodes and the second channel layer. The second source/drain electrodes may be formed to extend on a region between the first channel layer and the second channel layer. The second channel layer may include an oxide semiconductor material. The oxide semiconductor material may include a mixture of a material selected from the group consisting of ZnO, InO, SnO, InZnO, ZnSnO, and InSnO and at least one selected from the group consisting of Hf, Zr, Ti, Ta, Ga, Nb, V, Al, Ga, and Sn.

The light-sensing apparatus may include a first gate driver providing a gate signal to the switching transistor, a second gate driver providing a reset signal and a negative bias voltage to the light sensor transistor, and a signal output unit receiving a light sensing signal from the switching transistor and outputting the light sensing signal. The first gate driver may include a gate line that is connected to a gate electrode of the switching transistor and that provides a gate signal to the switching transistor. The second gate driver may include a reset line that is connected to a gate electrode of the light sensor transistor and that provides a reset signal to the light sensor transistor, and may include a bias line that is connected to the upper electrode and that provides a negative bias voltage to the upper electrode. The signal output unit may receive the light sensing signal by being connected to one of source/drain electrodes of the switching transistor. The light sensor transistor and the switching transistor may be serially connected to each other via their respective source/drain electrodes.

According to least one other example embodiment, an optical touch screen apparatus includes a display pixel unit for displaying an image and a light-sensing pixel unit for sensing incident light.

The display pixel unit may include a display cell and a first switching transistor for controlling ON/OFF of the display cell. The light-sensing pixel unit may include a light sensor transistor that senses incident light, a second switching transistor that outputs data from the light sensor transistor, and an upper electrode that is transparent, that is disposed on the light sensor transistor, and that applies a negative bias voltage to the light sensor transistor. The optical touch screen apparatus may include a gate line simultaneously connected to gate electrodes of the first and second switching transistors and providing a gate signal to the first and second switching transistors, an image data line connected to one of source/drain electrodes of the first switching transistor, a sensing line connected to one of source/drain electrodes of the second switching transistor and outputting a light sensing signal, a reset line connected to a gate electrode of the light sensor transistor and providing a reset signal to the light sensor transistor, and a bias line connected to the upper electrode and providing a negative bias voltage to the upper electrode.

The optical touch screen apparatus may include a first substrate that is transparent, and the light sensor transistor and the first and second switching transistors may be all disposed on the first substrate and use an oxide semiconductor material in a channel layer. The light sensor transistor may include a first gate electrode formed on a portion of the first substrate, a gate insulating layer coated on the first substrate and the first gate electrode, a first channel layer formed on the gate insulating layer so as to face the first gate electrode, a first source/drain electrode formed at one side of the first channel layer, a second source/drain electrode formed at the other side of the first channel layer, and a passivation layer that is transparent and is formed on the first and second source/drain electrodes and the first channel layer.

The second switching transistor may include a second gate electrode formed on a portion of the first substrate, the gate insulating layer coated on the first substrate and the second gate electrode, a second channel layer formed on the gate insulating layer so as to face the second gate electrode, the second source/drain electrode formed at one side of the second channel layer, a third source/drain electrode formed at the other side of the second channel layer, and the passivation layer formed on the second and third source/drain electrodes and the second channel layer. The second source/drain electrodes are formed to extend on a region between the first channel layer and the second channel layer.

The first switching transistor may include a third gate electrode formed on a portion of the first substrate, the gate insulating layer coated on the first substrate and the third gate electrode, a third channel layer formed on the gate insulating layer so as to face the third gate electrode, a fourth source/drain electrode formed at one side of the third channel layer, a fifth source/drain electrode formed at the other side of the third channel layer, and the passivation layer formed on the fourth and fifth source/drain electrodes and the third channel layer.

The first channel layer may include a material selected from the group consisting of ZnO, InO, SnO, InZnO, ZnSnO, and InSnO that are relatively light-sensitive, and the second and third channel layers include a material selected from the group consisting of XZnO, XInO, XSnO, XInZnO, XZnSnO, and XInSnO (where X indicates at least one material selected from the group consisting of Hf, Zr, Ti, Ta, Ga, Nb, V, and Al) that are relatively less light-sensitive than the first channel layer. The optical touch screen apparatus may include a second substrate that is transparent and disposed to face the first substrate, and a black matrix disposed on a portion of a surface of the second substrate so as to block the first and second switching transistors.

According to at least one example embodiment, a method of driving a light-sensing apparatus includes operations of outputting a light sensing signal by applying a gate signal to a gate electrode of a switching transistor serially connected to a light sensor transistor for sensing light, resetting the light sensor transistor by applying a reset signal to a gate electrode of the light sensor transistor, and applying a negative bias voltage to an upper electrode that is transparent and that is disposed on the light sensor transistor.

The operation of applying the negative bias voltage may be stopped while the reset signal is applied to the light sensor transistor. The negative bias voltage may be constantly applied to the upper electrode while the light sensor transistor operates.

According to some example embodiments, a light-sensing apparatus includes a channel bias electrode and a light sensing transistor including a first gate electrode and a channel layer, the first gate electrode on an opposite side of the channel layer from the channel bias electrode, at least one of the first gate electrode and the channel bias electrode being transparent.

According to some example embodiments, a method of driving a light-sensing apparatus includes determining a change in light sensitivity of a light sensor transistor over time and applying a bias voltage to a channel bias electrode of a light sensor transistor, a magnitude and polarity of the bias voltage at least partially offsetting the change in the light sensitivity.

According to some example embodiments, a method of driving a light-sensing apparatus includes outputting a light sensing signal by applying a gate signal to a gate electrode of a switching transistor serially connected to a light sensor transistor, resetting the light sensor transistor by applying a reset signal to a gate electrode of the light sensor transistor and applying a negative bias voltage to a transparent upper electrode that is on the light sensor transistor.

According to some example embodiments, an optical touch screen apparatus includes a display pixel unit configured to display an image, the display pixel unit including a display cell and a first switching transistor configured to control ON/OFF of the display cell, and a light-sensing pixel unit configured to sense incident light, the light-sensing pixel unit including a light sensor transistor configured to sense incident light, a second switching transistor configured to output data from the light sensor transistor, and a transparent upper electrode on the light sensor transistor, the upper electrode configured to apply a negative bias voltage to the light sensor transistor.

According to some example embodiments, a light-sensing apparatus includes a substrate, a light sensor transistor on the substrate, the light sensor transistor configured to sense light, a switching transistor on the substrate, the switching transistor configured to output data from the light sensor transistor, and a transparent upper electrode on the light sensor transistor, the upper electrode configured to apply a negative bias voltage to the light sensor transistor.

BRIEF DESCRIPTION OF THE DRAWINGS

Example embodiments will be more clearly understood from the following brief description taken in conjunction with the accompanying drawings.

FIG. 1 is a cross-sectional diagram schematically illustrating light sensor transistors according to at least one example embodiment;

FIG. 2 is a graph of drain current as a function of gate bias illustrating an operational characteristic of a light sensor transistor of FIG. 1;

FIG. 3 is a circuit diagram illustrating a light-sensing pixel of a light-sensing apparatus including a light sensor transistor of FIG. 1;

FIG. 4 is a timing diagram illustrating methods of driving a light-sensing pixel of FIG. 3 according to at least one example embodiment;

FIG. 5 is a timing diagram illustrating methods of driving the light-sensing pixel of FIG. 3 according to at least one example embodiment;

FIG. 6 is a block diagram schematically illustrating configurations of a light-sensing apparatus according to at least one example embodiment;

FIG. 7 is a circuit diagram illustrating a pixel of an in-cell type optical touch screen apparatus according to at least one example embodiment;

FIG. 8 is a cross-sectional diagram schematically illustrating a pixel of an in-cell type optical touch screen apparatus according to at least one example embodiment; and FIG. 9 is a cross-sectional diagram illustrating transistors of an in-cell type optical touch screen apparatus according to at least one example embodiment.

Figure 1:
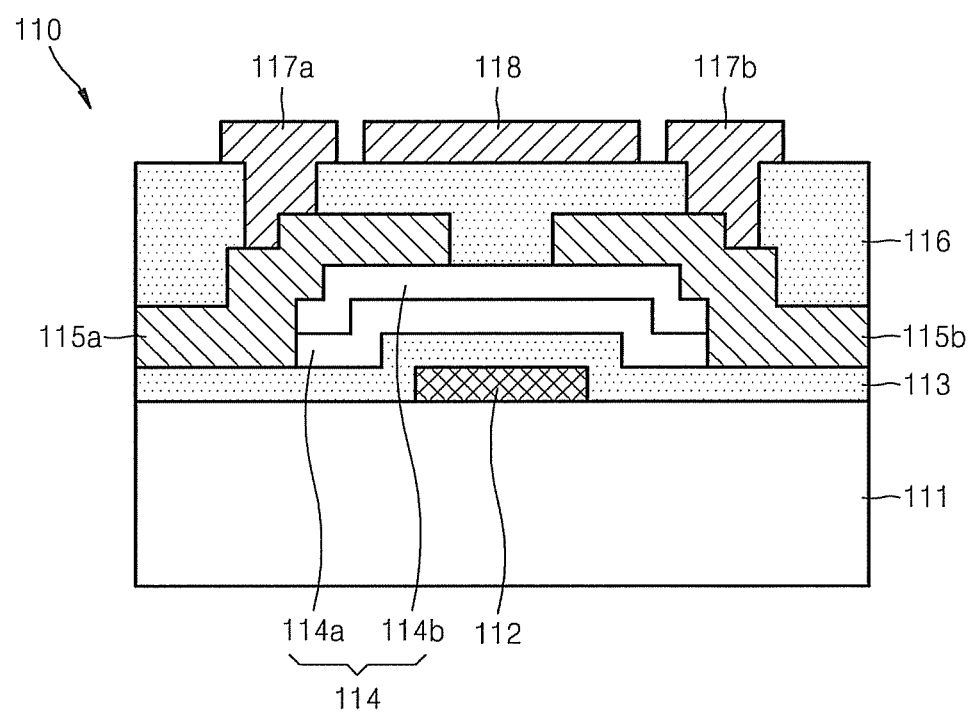
FIGS. 1-9 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional diagram schematically illustrating light sensor transistors 110 according to at least one example embodiment. Referring to FIG. 1, a gate electrode 112 may be on a portion of the substrate 111. A gate insulating layer 113 may be coated (e.g., completely coated) on the substrate 111 and the gate electrode 112. A channel layer 114 may be on the gate insulating layer 113 so as to face the gate electrode 112. First and second source/drain electrodes 115a and 115b may be at different sides of the channel layer 114. A passivation layer 116 (e.g., a transparent passivation layer) may be on (e.g., completely on) the first and second source/drain electrodes 115a and 115b and the channel layer 114. A first wiring 117a may be connected to the first source/drain electrode 115a through the passivation layer 116. A second wiring 117b may be connected to the second source/drain electrode 115b through the passivation layer 116. An upper electrode 118 (e.g., a transparent upper electrode) may be on a portion of the passivation layer 116 so as to face the channel layer 114.

The first source/drain electrode 115a may cover part of a left portion of the channel layer 114 and the gate insulating layer 113 at a left side of the channel layer 114. The second source/drain electrode 115b may cover part of a right portion of the channel layer 114 and the gate insulating layer 113 at a right side of the channel layer 114. The substrate 111 and the gate insulating layer 113 may include an insulating material. For example, the substrate 111 may be glass, and the gate insulating layer 113 may include a transparent insulating material (e.g., $SiO_2$ and/or $SiN_x$). The gate electrode 112, and the first and second source/drain electrodes 115a and 115b, may include a conductive metal, for example, molybdenum (Mo). The gate electrode 112, and the first and second source/drain electrodes 115a and 115b, may include a transparent conductive metal oxide material, for example, Indium Tin Oxide (ITO). The passivation layer 116 may include a transparent insulating material, for example, $SiO_2$ and/or $SiN_x$. The first wiring 117a and the second wiring 117b may include a conductive metal and/or a metal oxide material. In order to allow light to reach the channel layer 114 through the upper electrode 118, the upper electrode 118 on the passivation layer 116 may be a transparent conductive material, for example, ITO, Aluminum Zinc Oxide (AZO), Indium Zinc Oxide (IZO) and/or graphene.

The channel layer 114 may include an oxide semiconductor material that is light-sensitive. For example, the oxide semiconductor material of the channel layer 114 may include ZnO, InO, SnO, InZnO, ZnSnO, InSnO, and/or the like. The channel layer 114 may be include Hf, Zr, Ti, Ta, Ga, Nb, V, Al, Ga, and/or Sn. For example, the channel layer 14 may include a mixture of oxide semiconductor materials and at least one of Hf, Zr, Ti, Ta, Ga, Nb, V, Al, Ga, and/or Sn. The channel layer 114 may be a single oxide semiconductor layer. However, the present invention may not be limited thereto, and the channel layer 114 may be a multi-layer structure. For example, FIG. 1 illustrates a channel layer 114 including a double-layer structure with a lower channel layer 114a and an upper channel layer 114b on the lower channel layer 114a.

For example, the upper channel layer 114b may include ZnO, InO, SnO, InZnO, ZnSnO, and/or InSnO which may be the most light-sensitive. The lower channel layer 114a below the upper channel layer 114b may include a material that may be less light-sensitive than a material of the upper channel layer 114b but may be stable so as to prevent a threshold voltage of the light sensor transistor 110 from being decreased. For example, the lower channel layer 114a may include XZnO, XInO, XSnO, XInZnO, XZnSnO, and/or XInSnO (where X indicates at least one of Hf, Zr, Ti, Ta, Ga, Nb, V, and Al). The threshold voltage of the light sensor transistor 110 may be adjusted to approach 0 V according to a material and thickness of the lower channel layer 114a. However, the double-layer structure of FIG. 1 is an example and the channel layer 114 may be a single layer or a structure including three or more layers.

A light-sensitive oxide semiconductor material used in the upper channel layer 114b may increasingly shift the threshold voltage of the light sensor transistor 110 in a negative voltage direction over time, which may deteriorate an operational reliability of the light sensor transistor 110. In a case where the light sensor transistor 110 is used in an optical touch screen panel, the threshold voltage shift in the negative voltage direction may be accelerated due to light incident from a display panel (e.g., backlight of a liquid crystal display panel). In order to prevent or reduce a shift of the threshold voltage of the light sensor transistor 110 in the negative voltage direction, a negative (−) bias voltage may be applied to the transparent upper electrode 118. Referring to FIG. 1, when a negative electrical potential is induced above the gate electrode 112, a voltage to be applied to the gate electrode 112 to turn on the light sensor transistor 110 may be greater according to energy band theory.

Figure 2:
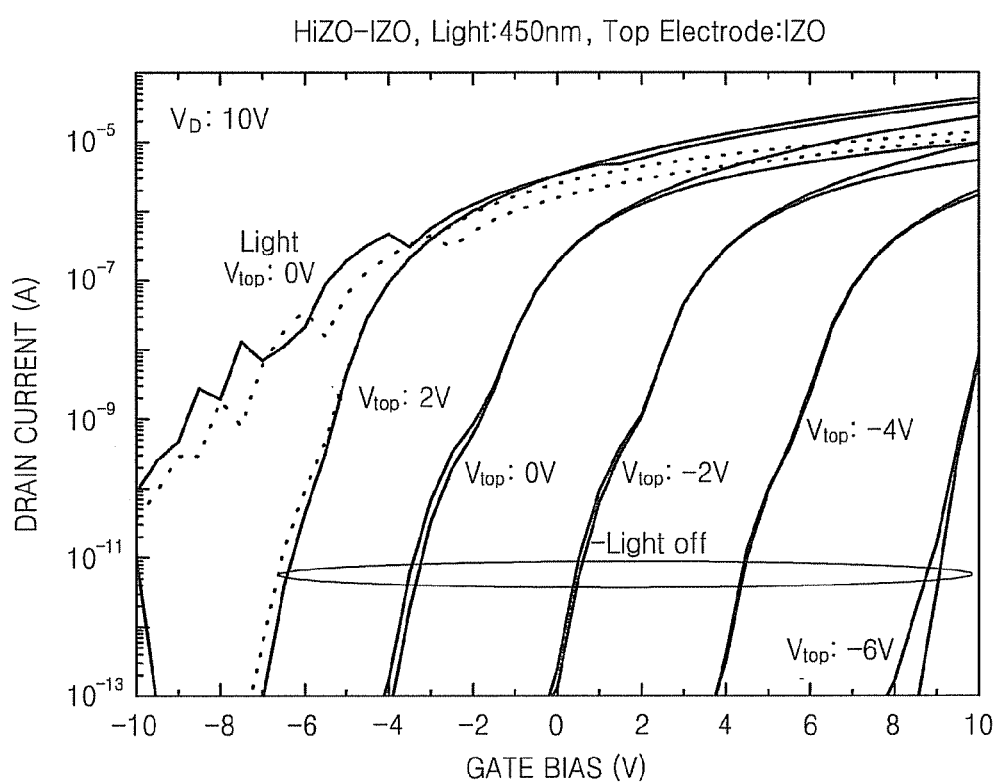

FIG. 2 is a graph of drain current as a function of gate bias illustrating an operational characteristic of a light sensor transistor of FIG. 1. FIG. 2 is a graph illustrating a phenomenon in which the threshold voltage of the light sensor transistor 110 is shifted in a positive (+) voltage direction by a negative bias voltage applied to the transparent upper electrode 118. The graph of FIG. 2 may corresponds to a case in which light with a 450 nm wavelength is incident on the light sensor transistor 110, a material of the lower channel layer 114a is HfInZnO (HIZO), a material of the upper channel layer 114b is InZnO, and a material of the transparent upper electrode 118 is IZO. A voltage of $V_D$=10 V may be applied between the first and second source/drain electrodes 115a and 115b of the light sensor transistor 110. Referring to the graph of FIG. 2, if a voltage is applied to the upper electrode 118 while light is not incident and a voltage applied to the transparent upper electrode 118 is 2 V, 0 V, −2 V, and −4 V, the threshold voltage of the light sensor transistor 110 may approximately be −7V, −4 V, 0 V, and 4 V.

It is possible to see that the threshold voltage of the light sensor transistor 110 may be shifted in a positive voltage direction when a negative bias voltage is applied to the upper electrode 118, and the threshold voltage of the light sensor transistor 110 may be shifted in a negative voltage direction when a positive bias voltage is applied to the upper electrode 118. If the amount of negative bias voltage that is applied to the upper electrode 118 is increased by as much as an amount of the threshold voltage of the light sensor transistor 110 which is shifted in the negative voltage direction over time, the threshold voltage shift in the negative voltage direction may be offset. By applying a negative bias voltage to the upper electrode 118, the threshold voltage of the light sensor transistor 110 may be about static. When light is incident on the light sensor transistor 110, the threshold voltage of the light sensor transistor 110 may be significantly shifted in the negative voltage direction. The existence of light incidence and an incidence amount may be measured by referring to a shift level of the threshold voltage of the light sensor transistor 110.

Figure 3:
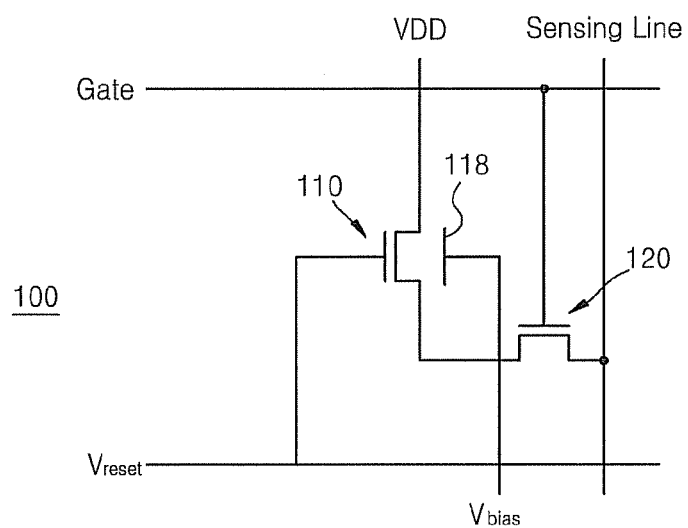

FIG. 3 is a circuit diagram illustrating one light-sensing pixel 100 of a light-sensing apparatus including a light sensor transistor 110 of FIG. 1. Referring to FIG. 3, the light-sensing pixel 100 may include a light sensor transistor 110 and a switching transistor 120 connected in series. For example, the light sensor transistor 110 and the switching transistor 120 may be connected to each other via source/drain electrodes. The light sensor transistor 110 may function as a light-sensing device for sensing incident light, and the switching transistor 120 may function as a switch for outputting a light sensing signal. The light-sensing pixel 100 may include a gate line Gate connected to a gate electrode of the switching transistor 120, a sensing line connected to a source/drain electrode of the switching transistor 120, a driving voltage line $V_{DD}$ connected to a source/drain electrode of the light sensor transistor 110, and a reset line $V_{reset}$ connected to a gate electrode of the light sensor transistor 110. In order to prevent a threshold voltage shift of the light sensor transistor 110, the light-sensing pixel 100 may include a bias line Vbias for applying a negative bias voltage to the upper electrode 118 of the light sensor transistor 110.

In a light-sensing pixel 100, when a gate signal is applied to the switching transistor 120 via the gate line Gate, the switching transistor 120 may be turned on. A current may flow from the light sensor transistor 110 to the sensing line via the switching transistor 120. An amount of current flowing from the light sensor transistor 110 to the sensing line may vary according to an intensity of light incident on the light sensor transistor 110. By measuring the amount of current flowing to the sensing line, it may be possible to calculate the intensity of light incident on the light sensor transistor 110. When the gate signal is not applied to the switching transistor 120, the switching transistor 120 may be turned off and the current may not flow in the sensing line. By turning on or off the switching transistor 120, a light sensing signal may be output from a specific light-sensing pixel 100.

Figure 4:
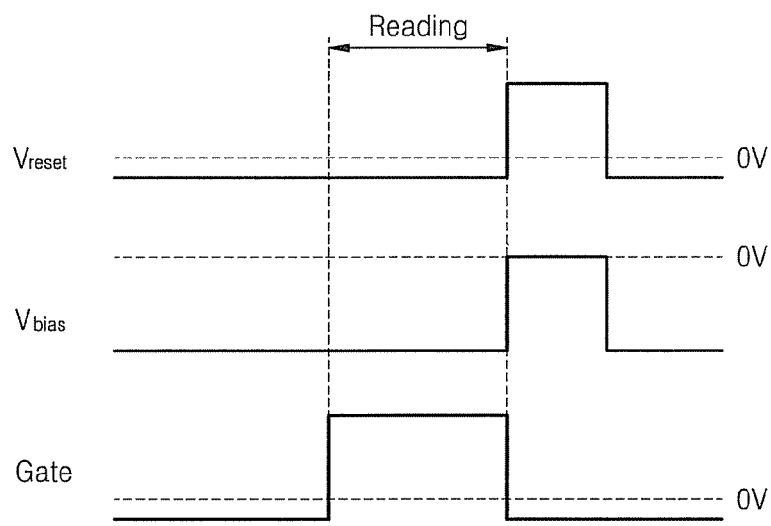
Figure 5:
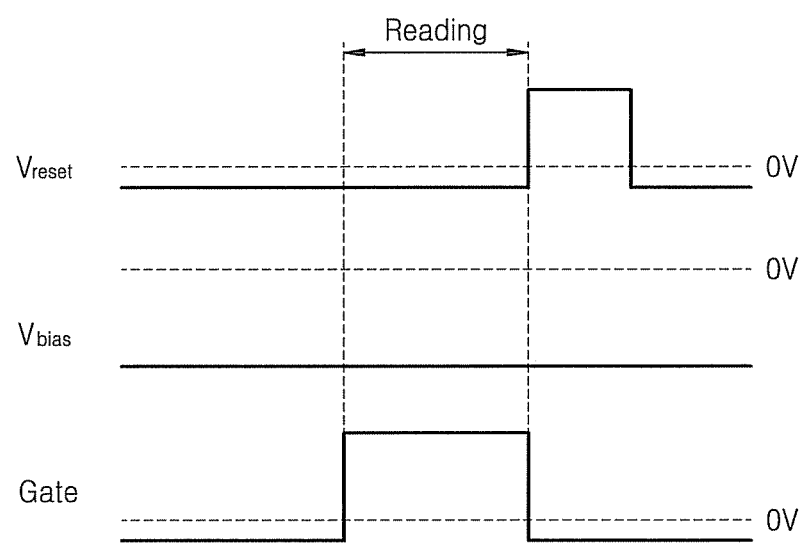

FIG. 4 is a timing diagram illustrating methods of driving a light-sensing pixel of FIG. 3 according to at least one example embodiment. FIG. 5 is a timing diagram illustrating methods of driving the light-sensing pixel of FIG. 3 according to at least one example embodiment. In a light-sensing apparatus including a light-sensing pixel 100, a negative bias voltage may be applied to the upper electrode 118 of the light sensor transistor 110 by various methods. For example, referring to FIG. 4, in order to read light sensing data from the light-sensing pixel 100, a positive gate signal may be applied to the switching transistor 120 for a period of time via the gate line Gate of the light-sensing pixel 100. After the light sensing data is read from the light-sensing pixel 100, a positive reset signal may be applied to the gate electrode of the light sensor transistor 110 via a reset line $V_{reset}$.

The reset signal may initialize the light sensor transistor 110 by removing charges accumulated on an interface of a channel layer of the light sensor transistor 110 while the light sensor transistor 110 is exposed to light. Due to the reset signal, the light sensor transistor 110 may return to an initial status before the light sensor transistor 110 was exposed to light. While the reset signal is not applied to the light sensor transistor 110, a negative bias voltage may be applied to the upper electrode 118 of the light sensor transistor 110 so as to prevent shift of the threshold voltage of the light sensor transistor 110 in a negative voltage direction. Only when the reset signal is applied to the light sensor transistor 110, the negative bias voltage may not be applied to the upper electrode 118. If the reset signal is not applied to the light sensor transistor 110, the negative bias voltage may be applied again to the upper electrode 118.

Referring to FIG. 5, a negative bias voltage may be constantly applied to the upper electrode 118 while the light-sensing apparatus operates. A gate signal and a reset signal may be applied to each of the switching transistor 120 and the light sensor transistor 110 in the same manner described above with reference to FIG. 4. The method of FIG. 5 may differ from the method of FIG. 4 in that the negative bias voltage may be constantly applied to the upper electrode 118 of the light sensor transistor 110 regardless of whether or not the reset signal is applied to the light sensor transistor 110. The light-sensing apparatus may include an array of the light-sensing pixels 100 and may include driving circuits for driving the plurality of the light-sensing pixels 100, respectively.

Figure 6:
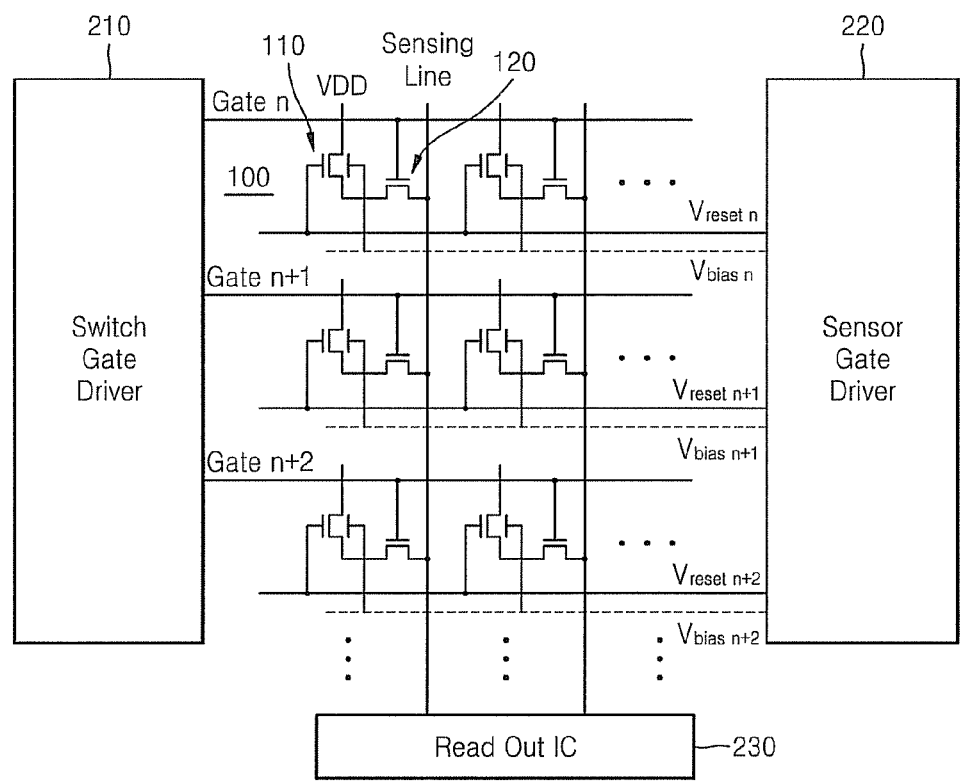

FIG. 6 is a block diagram schematically illustrating configurations of a light-sensing apparatus 200 according to at least one example embodiment. Referring to FIG. 6, the light-sensing apparatus 200 may include an array of the plurality of the light-sensing pixels 100 for sensing incident light, a switch gate driver 210 for sequentially providing a gate signal to the light-sensing pixels 100, a sensor gate driver 220 for sequentially providing a reset signal and a negative bias voltage to the light-sensing pixels 100, and a signal output unit 230 for receiving light sensing data from each of the light-sensing pixels 100 and outputting a signal.

The light-sensing pixels 100 may each have the structure of a light sensing pixel 100 of FIG. 3, and may be arrayed in columns and rows. For example, the light-sensing pixels 100 may be arrayed in a matrix having n rows and m columns. The switch gate driver 210 may control the light sensing data to be output from each of the light-sensing pixels 100 by separately activating the light-sensing pixels 100. To do so, the switch gate driver 210 may include a plurality of gate lines arranged in a row direction. The gate lines may be respectively connected to the light-sensing pixels 100 that may be arrayed along the same row, for example, the gate lines may be connected to gate electrodes of the switching transistors 120 in the light-sensing pixels 100.

The sensor gate driver 220 may initialize the light sensor transistor 110 in each of the light-sensing pixels 100 after reading out the light sensing data from each of the light-sensing pixels 100. The sensor gate driver 220 may include a plurality of reset lines that are arranged in the row direction. The reset lines may be respectively connected to the light-sensing pixels 100 that may be arrayed along the same row, for example, the reset lines may be connected to gate electrodes of the light sensor transistors 110 in the light-sensing pixels 100. The sensor gate driver 220 may provide the negative bias voltage to each of the light-sensing pixels 100 so as to prevent a threshold voltage shift of the light sensor transistor 110. The sensor gate driver 220 may include a plurality of bias lines that may be arranged in the row direction. The bias lines may be respectively connected to the light-sensing pixels 100 that may be arrayed along the same row, for example, the bias lines may be connected to the upper electrodes 118 of the light sensor transistors 110 in the light-sensing pixels 100.

The signal output unit 230 may receive the light sensing data from each of the light-sensing pixels 100 and then may output a signal. The signal output unit 230 may include a plurality of sensing lines that may be arranged in a column direction. The sensing lines may be respectively connected to the light-sensing pixels 100 that may be arrayed along the same column, for example, the sensing lines may be connected to source/drain electrodes of the switching transistors 120 in the light-sensing pixels 100, respectively.

In a light-sensing apparatus 200 with the aforementioned structure, the switch gate driver 210 may sequentially provide a gate signal row-by-row to the light-sensing pixels 100 via the gate lines. For example, the switch gate driver 210 may provide the gate signal to the light-sensing pixels 100 of an $n_{th}$ row and then may provide the gate signal to the light-sensing pixels 100 of an $n+1_{th}$ row. If the switch gate driver 210 provides the gate signal to the light-sensing pixels 100 of the $n+1_{th}$ row, the sensor gate driver 220 may provide a reset signal to the light-sensing pixels 100 of the $n_{th}$ row. The sensor gate driver 220 may provide the light-sensing pixels 100 with a bias voltage that may have a pulse shape of FIG. 4 and/or a continuous bias voltage of FIG. 5.

The light-sensing pixel 100 and the light-sensing apparatus 200 may be used in a new image sensor to replace an existing image sensor such as a charge-coupled device (CCD) image sensor and/or a complementary metal-oxide-semiconductor (CMOS) image sensor. The light-sensing pixel 100 and the light-sensing apparatus 200 may be applied to a remote-type optical touch screen apparatus that may use light, instead of a touch screen apparatus that may use a touch of a finger or a pen. Because the light-sensing pixel 100 and the light-sensing apparatus 200 may be simply formed of only two thin film transistors (TFTs), an in-cell type optical touch screen apparatus may include a display pixel integrated with a light-sensing pixel.

Figure 7:
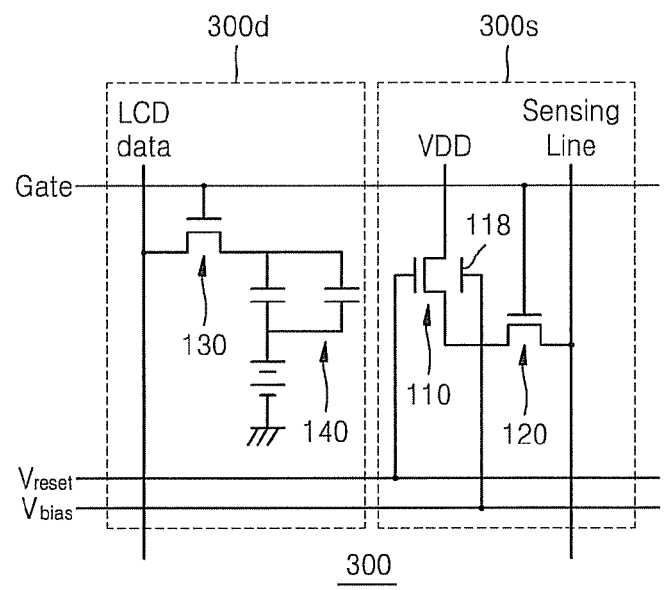

FIG. 7 is a circuit diagram of a pixel of an in-cell type optical touch screen apparatus 300 according to at least one example embodiment. Referring to FIG. 7, the pixel of the in-cell type optical touch screen apparatus 300 may include a display pixel unit 300d and a light-sensing pixel unit 300s. The display pixel unit 300d may include a display cell 140 (e.g., a liquid crystal cell in a liquid crystal display (LCD)) and a first switching transistor 130 for controlling the on/off of the display cell 140. The light-sensing pixel unit 300s may include the light sensor transistor 110 for sensing incident light and a second switching transistor 120 for outputting a light sensing signal from the light sensor transistor 110. Gate electrodes of the first and second switching transistors 130 and 120 may be connected to one gate line Gate. One of the source/drain electrodes of the first switching transistor 130 may be connected to an image data line LCD-Data, and the other source/drain of the first switching transistor 130 may be connected to the display cell 140.

One of the source/drain electrodes of the second switching transistor 120 may be connected to a sensing line, and the other source/drain electrode of the second switching transistor 120 may be connected to one of source/drain electrodes of the light sensor transistor 110. The other source/drain electrode of the light sensor transistor 110 may be connected to a driving voltage line Vdd, and a gate electrode of the light sensor transistor 110 may be connected to a reset line $V_{reset}$. The upper electrode 118 of the light sensor transistor 110 may be connected to a bias line $V_{bias}$ for applying a negative bias voltage. In an in-cell type optical touch screen apparatus 300, the upper electrode 118 of the light sensor transistor 110 and an electrode of the display cell 140 may be simultaneously formed, so that an additional process may not be separately required to form the upper electrode 118.

Figure 8:
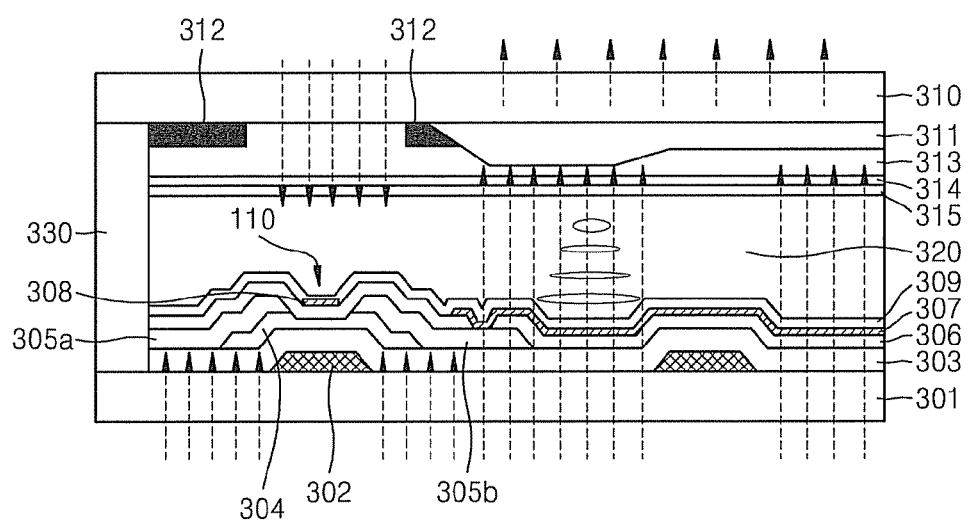

FIG. 8 is a cross-sectional diagram schematically illustrating a pixel of an in-cell type optical touch screen apparatus 300. Referring to FIG. 8, the in-cell type optical touch screen apparatus 300 may include a transparent bottom substrate 301 and a transparent front substrate 310 that may face each other, a liquid crystal layer 320 between the bottom substrate 301 and the front substrate 310, and a partition wall 330 for separating two adjacent pixels. A plurality of TFTs for operation of an in-cell type optical touch screen apparatus 300, an electrode, and various layers may be on a top surface of the bottom substrate 301, and a plurality of colors filters, an electrode, and various layers may be disposed on a bottom surface of the front substrate 310. The plurality of TFTs may include the light sensor transistor 110 and the first and second switching transistors 130 and 120. For convenience of description, FIG. 8 only illustrates the light sensor transistor 110, and the first and second switching transistors 130 and 120 are omitted.

A gate electrode 302 may be on a portion of the bottom substrate 301, and a gate insulating layer 303 may be completely coated on the gate electrode 302 and the bottom substrate 301. A channel layer 304 may be on a portion of the gate insulating layer 303 so as to correspond to the gate electrode 302, and first and second source/drain electrodes 305a and 305b may be on ends of the channel layer 304. A transparent passivation layer 306 may be coated to completely cover the first and second source/drain electrodes 305a and 305b, the channel layer 304, and the gate insulating layer 303. A first transparent electrode 307 may be on a portion of the passivation layer 306. For example, the first transparent electrode 307 may be connected to the second source/drain electrodes 305b through the passivation layer 306. A transparent upper electrode 308 may be on a portion of the passivation layer 306 to correspond to the channel layer 304. A polyimide layer 309 may be completely formed on the passivation layer 306, the first transparent electrode 307, and the upper electrode 308. The polyimide layer 309 may improve an interface characteristic and an alignment characteristic of the liquid crystal layer 320.

The gate electrode 302, the gate insulating layer 303, the channel layer 304, the first and second source/drain electrodes 305a and 305b, the passivation layer 306, and the upper electrode 308 may constitute the light sensor transistor 110. The upper electrode 308 may be connected to a bias line Vbias and may provide a negative bias voltage to the light sensor transistor 110. The upper electrode 308 may be of the same material as the first transparent electrode 307, and the upper electrode 308 and the first transparent electrode 307 may be simultaneously formed. Because the upper electrode 308 may also be formed when the first transparent electrode 307 is formed, an additional process and an additional mask to form the upper electrode 308 of the light sensor transistor 110 may not be required. In a case of the in-cell type optical touch screen apparatus 300, it may be possible to form the upper electrode 308 without an increase in manufacturing costs and manufacturing time.

A color filter 311 for defining a color of light to be output and a black matrix 312 for blocking a driving circuit may be formed on portions of the bottom surface of the bottom substrate 301. The black matrix 312 may block the first and second switching transistors 130 and 120 and the rest of the circuit devices that are not shown in FIG. 8. However, in order to allow external light to be incident on the light sensor transistor 110, the black matrix 312 and the color filter 311 may not be on portions of the bottom surface which may correspond to the light sensor transistor 110. A passivation layer 313 may be coated to completely cover the black matrix 312 and the color filter 311, and a second transparent electrode 314 may be on the passivation layer 313. A polyimide layer 315 may completely coat a surface of the second transparent electrode 314 so as to improve an interface characteristic and an alignment characteristic of the liquid crystal layer 320.

For convenience of description, FIG. 8 only illustrates the light sensor transistor 110 on the bottom substrate 301. However, the first and second switching transistors 130 and 120 may also be formed together on the bottom substrate 301.

Figure 9:
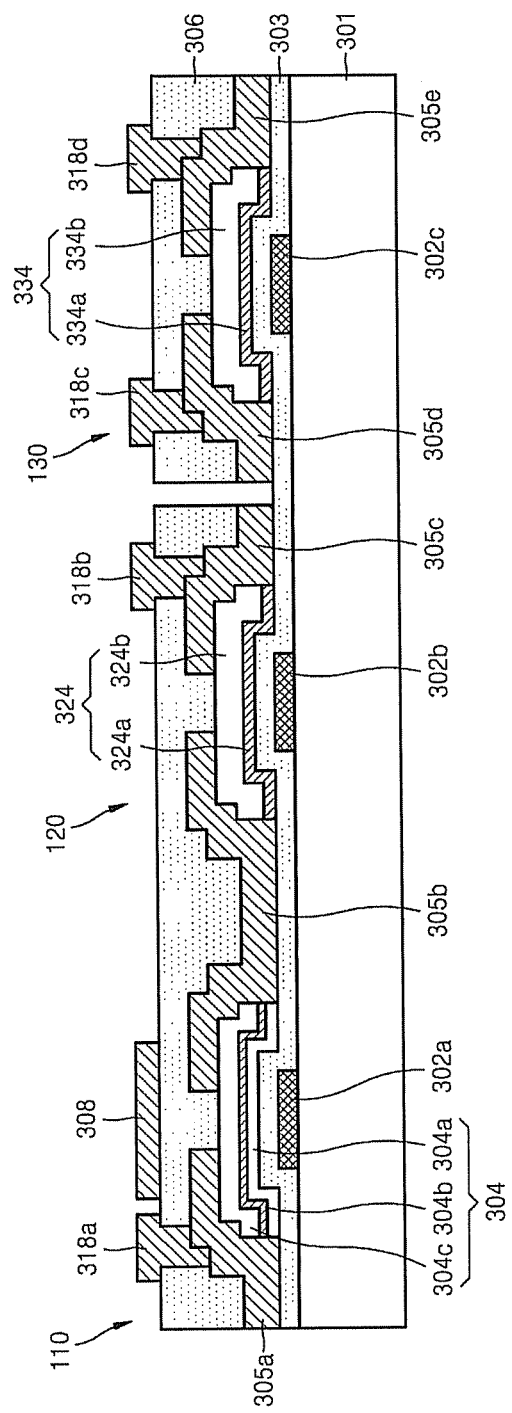

FIG. 9 is a cross-sectional diagram illustrating a transistor structure of an in-cell type optical touch screen apparatus 300 including the light sensor transistor 110 and the first and second switching transistors 130 and 120. Referring to FIG. 9, first through third gate electrodes 302a, 302b, and 302c may be on portions of a top surface of the bottom substrate 301. The first gate electrode 302a may be a gate electrode of the light sensor transistor 110 and may be connected to the reset line $V_{reset}$ of FIG. 7. The second gate electrode 302b may be a gate electrode of the second switching transistor 120, and the third gate electrode 302c may be a gate electrode of the first switching transistor 130. The second and third gate electrodes 302b and 302c may both be connected to the gate line Gate of FIG. 7. The gate insulating layer 303 may be completely coated on the bottom substrate 301 so as to cover the first through third gate electrodes 302a, 302b, and 302c. On the gate insulating layer 303, a first channel layer 304 may be on a portion corresponding to the first gate electrode 302a, a second channel layer 324 may be on a portion corresponding to the second gate electrode 302b, and a third channel layer 334 may be on a portion corresponding to the third gate electrode 302c.

The first channel layer 304 may have a triple-layer structure including a lower channel layer 304a, a central channel layer 304b, and an upper channel layer 304c. However, the first channel layer 304 may have a double-layer structure, a single-layer structure, or a structure including four or more layers. In a case where the first channel layer 304 is a triple-layer structure, a material of the lower channel layer 304a may be HfInZnO, a material of the central channel layer 304b may be InZnO, and a material of the upper channel layer 304c may be GaInZnO, for example. In this case, the upper channel layer 304c may function as a protective layer that may protect the central channel layer 304b. The second and third channel layers 324 and 334 may be formed of an oxide material that may be less light-sensitive than the first channel layer 304.

The second and third channel layers 324 and 334 may be single-layer structures or multi-layer structure as illustrated in FIG. 9 in which the second and third channel layers 324 and 334 may be double-layer structures. In a case where the second and third channel layers 324 and 334 are double-layer structures, the second channel layer 324 may include, for example, a lower channel layer 324a of HfInZnO and an upper channel layer 324b of GaInZnO. Similar to the second channel layer 324, the third channel layer 334 may include, for example, a lower channel layer 334a of HfInZnO and an upper channel layer 334b of GaInZnO. In a case where the second and third channel layers 324 and 334 are a single-layer structure, the second and third channel layers 324 and 334 may be, for example, of GaInZnO and/or HfInZnO. The second and third channel layers 324 and 334 that may be less light-sensitive and may be stable, and a threshold voltage shift of the light sensor transistor 110 in a negative voltage direction may hardly occur.

Source/drain electrodes 305a, 305b, 305c, 305d, and 305e may be formed sides of the first through third channel layers 304, 324, and 334, respectively. For example, the first source/drain electrode 305a may be at a left side of the first channel layer 304, the second source/drain electrodes 305b may be between a right side of the first channel layer 304 and a left side of the second channel layer 324, and a third source/drain electrode 305c may be at a right side of the second channel layer 324. The second source/drain electrodes 305b may be connected between the first channel layer 304 and the second channel layer 324, so that the second source/drain electrodes 305b may serially connect the light sensor transistor 110 and the second switching transistor 120. A fourth source/drain electrode 305d and a fifth source/drain electrode 305e may be at sides of the third channel layer 334.

The passivation layer 306 may be completely coated to cover the first through third channel layers 304, 324, and 334, and the first through fifth source/drain electrodes 305a, 305b, 305c, 305d, and 305e. The transparent upper electrode 308 may be on the portion of the passivation layer 306 corresponding to the first channel layer 304. A first wiring 318a may be connected to the first source/drain electrode 305a through the passivation layer 306, and a second wiring 318b may be connected to the third source/drain electrode 305c through the passivation layer 306. The first wiring 318a may be connected to the driving voltage line Vdd of FIG. 7, and the second wiring 318b may be connected to the sensing line. A third wiring 318c may be connected to the fourth source/drain electrode 305d through the passivation layer 306, and a fourth wiring 318d may be connected to the fifth source/drain electrode 305e through the passivation layer 306. For example, the third wiring 318c may be connected to the image data line LCD-Data of FIG. 7, and the fourth wiring 318d may be connected to the display cell 140.

As illustrated in FIG. 9, the light sensor transistor 110 and the first and second switching transistors 130 and 120, which are also shown in FIG. 7, may be formed together on the bottom substrate 301 as oxide semiconductor transistors of a same structure. The light sensor transistor 110 and the first and second switching transistors 130 and 120 may be simultaneously formed to minimize or reduce the number of manufacturing processes. According to at least one example embodiment, the light sensor transistor 110 may be the first channel layer 304 that is relatively light-sensitive whereas the first and second switching transistors 130 and 120 may be the second and third channel layers 324 and 334 that are less light-sensitive and may be stable (e.g., stable without a top gate bias). The upper electrode 308 for preventing or reducing the threshold voltage shift in the negative voltage direction may be only in the light sensor transistor 110. Although the second and third channel layers 324 and 334 of the first and second switching transistors 130 and 120 may be less light-sensitive than the first channel layer 304 of the light sensor transistor 110, the second and third channel layers 324 and 334 of the first and second switching transistors 130 and 120 may be light-sensitive to a certain extent. The first and second switching transistors 130 and 120 may be blocked by the black matrix 312 of FIG. 8.

While example embodiments have been particularly shown and described, it will be understood by one of ordinary skill in the art that variations in form and detail may be made therein without departing from the spirit and scope of the claims.

What is claimed is:

1. A light-sensing apparatus, comprising:
 a substrate;
 a light sensor transistor on the substrate, the light sensor transistor configured to sense light;
 a switching transistor on the substrate, the switching transistor configured to output data from the light sensor transistor;
 a transparent upper electrode on the light sensor transistor, the upper electrode configured to apply a negative bias voltage to the light sensor transistor;
 a first gate driver configured to provide a gate signal to the switching transistor;
 a second gate driver configured to provide a reset signal and the negative bias voltage to the light sensor transistor; and
 a signal output unit configured to receive a light sensing signal from the switching transistor and output the light sensing signal,
 wherein the second gate driver includes a reset line connected to a gate electrode of the light sensor transistor, and the reset line is configured to provide the reset signal to the light sensor transistor, and
 wherein the second gate driver further includes a bias line connected to the upper electrode, and the bias line is configured to provide the negative bias voltage to the upper electrode.

2. The light-sensing apparatus of claim 1, wherein the light sensor transistor comprises:
 a first gate electrode on the substrate;
 a gate insulating layer on the substrate and the first gate electrode;
 a first channel layer on the gate insulating and the first gate electrode;
 a first source/drain electrode at a first side of the first channel layer;
 a second source/drain electrode at a second side of the first channel layer; and
 a transparent passivation layer on the first and second source/drain electrodes and the first channel layer.

3. The light-sensing apparatus of claim 2, wherein the upper electrode is on the passivation layer and the first channel layer.

4. The light-sensing apparatus of claim 2, wherein the first channel layer includes an oxide semiconductor material.

5. The light-sensing apparatus of claim 4, wherein the oxide semiconductor material includes one of
 at least one of ZnO, InO, SnO, InZnO, ZnSnO, or InSnO, and
 a mixture of
  at least one of ZnO, InO, SnO, InZnO, ZnSnO, or InSnO, and
  at least one of Hf, Zr, Ti, Ta, Ga, Nb, V, Al, Ga, or Sn.

6. The light-sensing apparatus of claim 4, wherein
 the first channel layer includes a lower channel layer on the gate insulating layer and an upper channel layer on the lower channel layer,
 the lower channel layer includes at least one of XZnO, XInO, XSnO, XInZnO, XZnSnO, or XInSnO, X being at least one of Hf, Zr, Ti, Ta, Ga, Nb, V, or Al,
 the upper channel layer includes one of ZnO, InO, SnO, InZnO, ZnSnO, or InSnO, and
 a light sensitivity of the upper channel layer is greater than a light sensitivity of the lower channel layer.

7. The light-sensing apparatus of claim 2, wherein the switching transistor comprises:
 a second gate electrode on the substrate;
 the gate insulating layer on the substrate and the second gate electrode;
 a second channel layer on the gate insulating layer and the second gate electrode;
 the second source/drain electrode at a first side of the second channel layer;
 a third source/drain electrode at a second side of the second channel layer; and
 the passivation layer on the second and third source/drain electrodes and the second channel layer, and
 wherein the second source/drain electrode extends onto a region between the first channel layer and the second channel layer.

8. The light-sensing apparatus of claim 7, wherein the second channel layer includes an oxide semiconductor material.

9. The light-sensing apparatus of claim 8, wherein the oxide semiconductor material includes a mixture of
 at least one of ZnO, InO, SnO, InZnO, ZnSnO, or InSnO, and
 at least one of Hf, Zr, Ti, Ta, Ga, Nb, V, Al, Ga, or Sn.

10. The light-sensing apparatus of claim 1, wherein
 the first gate driver includes a gate line connected to a gate electrode of the switching transistor, and
 the gate line is configured to provide the gate signal to the switching transistor.

11. The light-sensing apparatus of claim 1, wherein the signal output unit is configured to receive the light sensing signal from one of source/drain electrodes of the switching transistor.

12. The light-sensing apparatus of claim 1, wherein the light sensor transistor and the switching transistor are serially connected to each other via at least one source/drain electrode.

13. An optical touch screen apparatus, comprising:
 a display pixel unit configured to display an image, the display pixel unit including a display cell and a first switching transistor configured to control ON/OFF of the display cell; and a light-sensing pixel unit configured to sense incident light, the light-sensing pixel unit including,
  a light sensor transistor configured to sense incident light,
  a second switching transistor configured to output data from the light sensor transistor,
  a transparent upper electrode on the light sensor transistor, the upper electrode configured to apply a negative bias voltage to the light sensor transistor,
  a first gate driver configured to provide a gate signal to the second switching transistor,
  a second gate driver configured to provide a reset signal and the negative bias voltage to the light sensor transistor, and
  a signal output unit configured to receive a light sensing signal from the second switching transistor and output the light sensing signal,
wherein the second gate driver includes a reset line connected to a gate electrode of the light sensor transistor, and the reset line is configured to provide the reset signal to the light sensor transistor, and
wherein the second gate driver further includes a bias line connected to the upper electrode, and the bias line is configured to provide the negative bias voltage to the upper electrode.

14. The optical touch screen apparatus of claim 13, further comprising:
  a gate line connected to gate electrodes of the first and second switching transistors, the gate line configured to provide the gate signal to the first and second switching transistors;
  an image data line connected to one of source/drain electrodes of the first switching transistor; and
  a sensing line connected to one of source/drain electrodes of the second switching transistor, the sensing line configured to output the light sensing signal.

15. The optical touch screen apparatus of claim 13, further comprising:
  a transparent first substrate,
  wherein the light sensor transistor and the first and second switching transistors are on the first substrate, and
  channel layers of the light sensor transistor and the first and second switching transistors include an oxide semiconductor material.

16. The optical touch screen apparatus of claim 15, wherein the light sensor transistor comprises:
  a first gate electrode on the first substrate;
  a gate insulating layer on the first substrate and the first gate electrode;
  a first channel layer on the gate insulating layer and the first gate electrode;
  a first source/drain electrode at a first side of the first channel layer;
  a second source/drain electrode at a second side of the first channel layer; and
  a transparent passivation layer is on the first and second source/drain electrodes and the first channel layer.

17. The optical touch screen apparatus of claim 16, wherein the upper electrode is on the passivation layer and the first channel layer.

18. The optical touch screen apparatus of claim 16, wherein the second switching transistor comprises:
  a second gate electrode on the first substrate;
  the gate insulating layer on the first substrate and the second gate electrode;
  a second channel layer on the gate insulating layer and the second gate electrode;
  the second source/drain electrode at a first side of the second channel layer,
  a third source/drain electrode at a second side of the second channel layer; and
  the passivation layer on the second and third source/drain electrodes and the second channel layer,
  wherein the second source/drain electrode extends onto a region between the first channel layer and the second channel layer.

19. The optical touch screen apparatus of claim 18, wherein the first switching transistor comprises:
  a third gate electrode on the first substrate;
  the gate insulating layer on the first substrate and the third gate electrode;
  a third channel layer on the gate insulating layer and the third gate electrode;
  a fourth source/drain electrode at a first side of the third channel layer;
  a fifth source/drain electrode at a second side of the third channel layer; and
  the passivation layer on the fourth and fifth source/drain electrodes and the third channel layer.

20. The optical touch screen apparatus of claim 19, wherein
  a material of the first channel layer includes one of ZnO, InO, SnO, InZnO, ZnSnO, or InSnO,
  materials of the second and third channel layers include one of XZnO, XInO, XSnO, XInZnO, XZnSnO, or XInSnO, X being at least one of Hf, Zr, Ti, Ta, Ga, Nb, V, or Al, and
  a light sensitivity of the material of the first channel layer is greater than a light sensitivity of the materials of the second and third channel layers.

21. The optical touch screen apparatus of claim 15, further comprising:
  a transparent second substrate on the first substrate; and
  a black matrix on a surface of the second substrate, the black matrix configured to block light from reaching the first and second switching transistors.

22. A light-sensing apparatus, comprising:
  a substrate;
  a light sensor transistor on the substrate, the light sensor transistor configured to sense light;
  a switching transistor on the substrate, the switching transistor configured to output data from the light sensor transistor;
  a transparent upper electrode on the light sensor transistor; and
  a bias line connected to the upper electrode and configured to provide a negative bias voltage to the upper electrode;
  a first gate driver configured to provide a gate signal to the switching transistor;
  a second gate driver configured to provide a reset signal and the negative bias voltage to the light sensor transistor; and
  a signal output unit configured to receive a light sensing signal from the switching transistor and output the light sensing signal,
wherein the second gate driver includes a reset line connected to a gate electrode of the light sensor transistor, the reset line is configured to provide the reset signal to the light sensor transistor, and the second gate driver further includes the bias line.

* * * * *